United States Patent [19]
Langhof et al.

[11] Patent Number: 5,530,370
[45] Date of Patent: Jun. 25, 1996

[54] TESTING APPARATUS FOR TESTING AND HANDLING A MULTIPLICITY OF DEVICES

[75] Inventors: Marco Langhof, Magdeburg; Alfred Biwer, Ammerbuch, both of Germany

[73] Assignee: Hewlett-Packard Company, Palo Alto, Calif.

[21] Appl. No.: 298,439

[22] Filed: Aug. 30, 1994

[30] Foreign Application Priority Data

Sep. 20, 1993 [EP] European Pat. Off. .............. 93115094

[51] Int. Cl.$^6$ ........................... G01R 31/02; G01R 31/28
[52] U.S. Cl. ........................... 324/754; 364/489; 324/73.1
[58] Field of Search .................................. 324/754, 73.1, 324/158.1, 66, 67; 73/117.2; 361/428; 364/482, 488, 579; 29/281.1, 566.3, 705, 712, 720, 739, 755, 624, 739

[56] References Cited

U.S. PATENT DOCUMENTS 4,218,745  8/1980  Perkins .................................. 364/489
5,023,791  6/1991  Herzberg et al. .................. 364/424.04

FOREIGN PATENT DOCUMENTS

| 0068994A3 | 1/1983  | European Pat. Off. . |
| 0162207A1 | 11/1985 | European Pat. Off. . |
| 0296884A2 | 12/1988 | European Pat. Off. . |
| 0541837A1 | 5/1993  | European Pat. Off. . |
| 0541839A1 | 5/1993  | European Pat. Off. . |
| 0541840A1 | 5/1993  | European Pat. Off. . |

Primary Examiner—Kenneth A. Wieder
Assistant Examiner—Barry C. Bowser

[57] ABSTRACT

A testing apparatus for testing and handling a multiplicity of devices, in particular electronic components such as integrated circuits or boards, comprises a test executor with a multiplicity of hierarchical operating levels assigned to respective physical or logical entities. At each level except the lowest one, test level controllers are provided which include a pre-activity sequence of tasks, a call to a lower operating level, a return from said lower operating level, and a post-activity sequence of tasks. At the lowest level, device test processors execute the actual test.

20 Claims, 3 Drawing Sheets

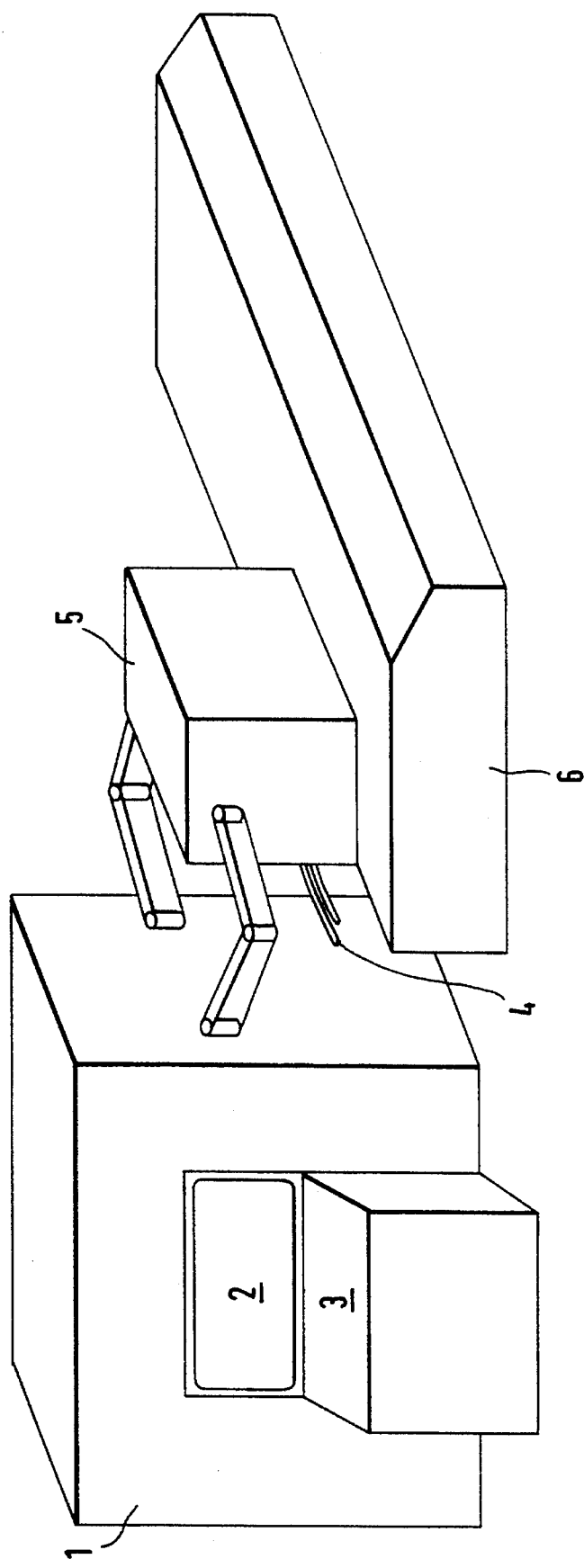

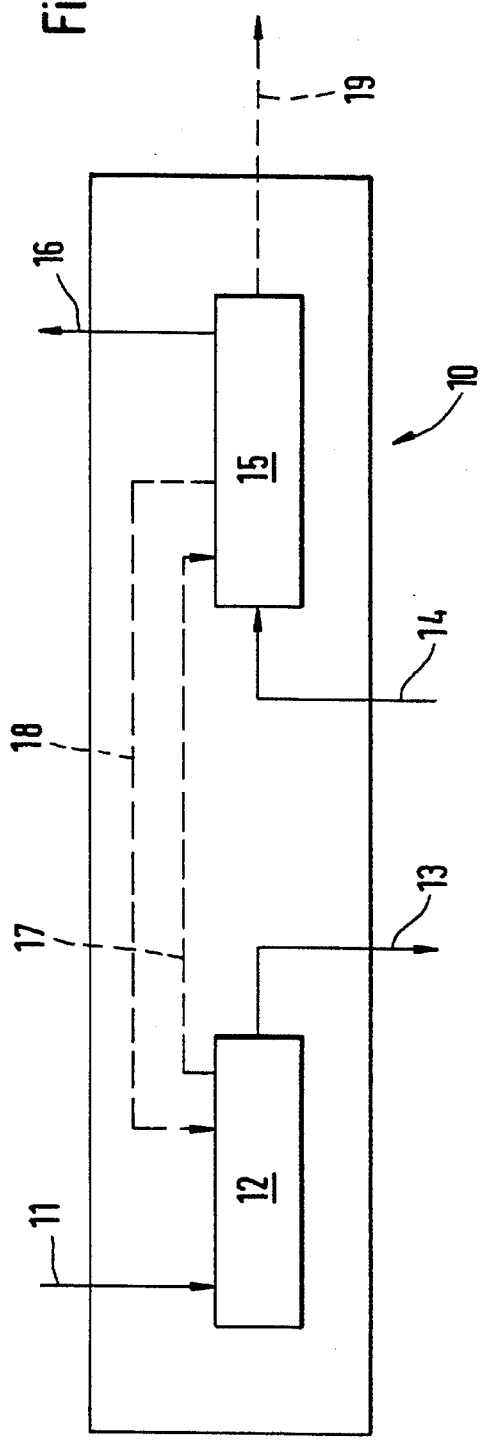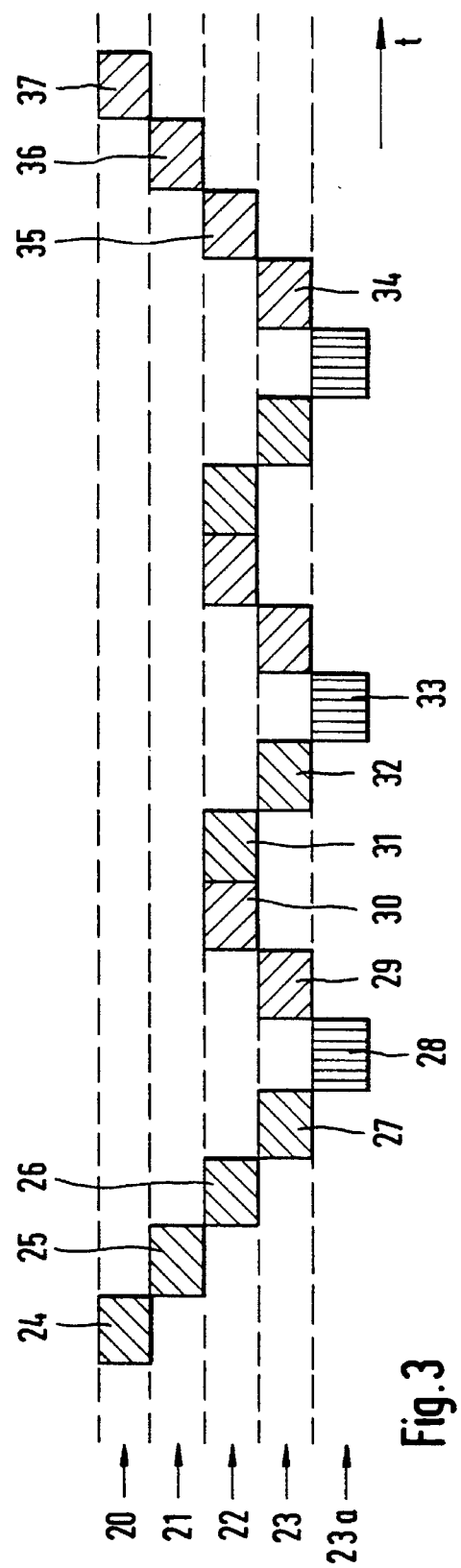

TESTING APPARATUS FOR TESTING AND HANDLING A MULTIPLICITY OF DEVICES

FIELD OF THE INVENTION

This invention relates to a testing apparatus for testing and handling a multiplicity of devices. More specifically, it relates to a tester for testing electronic circuitry, particularly integrated circuits.

BACKGROUND OF THE INVENTION

Electronic testing equipment, such as integrated circuit or board testers, has become more and more complex over the last decades. This is particularly due to the increased functionality of the circuitry to be tested—e.g., latest microprocessors, RISC CPU's, combined logic/memory IC's—, which calls for complex test procedures and highly sophisticated tester equipment.

However, there is also another aspect related to this technology. This is the demand for an integrated tester environment, particularly under production conditions. That is, the integrated test environment does not only include the tester itself, but also supporting machinery, e.g., a prober or handler for automatic supply and exchange of devices to be tested (DUT's, e.g., integrated circuits or loaded or unloaded boards). Further, the handling machinery has to be able to deal with several physical or logical entities, such as lots or cassettes containing DUT's, and process them in the correct order. There are even logical or physical entities which have to be handled by the tester itself (not by additional handling tools); a common example is a wafer containing a multiplicity of integrated circuits (IC's) of the same kind. In the latter case, the contacts of the test head have to be advanced from one die to the next one as soon as the first one has been tested (or the wafer has to be advanced instead), and the correct steps have to be taken when the complete wafer has been tested (e.g., the wafer has to be removed and replaced with the next one).

It will be understood that the sequence of operating steps to be performed is not easy to define. Even worse, they depend completely upon the kind of device to be tested (e.g., board, IC, or wafer), and upon the available equipment (e.g., kind of IC handler). Thus, the manufacturer of a tester cannot provide all of the required control hardware and/or software to a customer; instead, the customer has to adapt the tester himself to his specific demands. On the other hand, once all controllers for a given test equipment have been set up, there is seldom a need for later modifications, just as the available hardware components are not subject to frequent modification or replacement. What may in fact be changed are the test specifications of the IC or the board, but these are widely independent of the environmental specifications.

It will be appreciated that the initial set-up of the control equipment by the customer is a laborious and time-consuming task. The manufacturers of IC or board testers have therefore already tried to meet the customer's demands by the provision of configurable control programs, i.e. control programs which permit adaptation to a specific test environment. However, the control equipment so far known in the art is still difficult and complex to operate. This is mainly due to the fact that the complete sequence of control functions has to be defined without any supporting structure, and that the operator is forced never to lose sight of the overall process, despite of the specific part of the process he is editing. His task can thus still be described as fully-qualified programming, despite the available tools, with all related requirements in terms of time and work.

Yet another drawback of the known control programs is that, once they have been created, they are not easy to modify, due to their complex structure. Further, it is not easy to split the task of making the set-up between multiple operators, just as any of them has to have the "full picture", i.e., knowledge about the overall testing process, and about the work of his colleagues.

Thus, there is a need for a new control processor which avoids the above drawbacks.

SUMMARY OF THE INVENTION

The present invention relates to a tester which includes a new test executor (or test program executor, i.e., the device which controls overall operation of the test). This test executor permits a "structured" set-up. Basically, a testing apparatus according to the invention comprises the following features:

A test executor provided for controlling operation of the individual test steps, and preferably also the sequence of said test steps, at least one test adapter for receiving at least one device to be tested, a multiplicity of physical or logical entities in which the devices to be tested are arranged, wherein said test executor includes at least two (preferably multiple) hierarchical operating levels each assigned to one of said physical or logical entities, and further including at least one test level controller set up to perform at least the following sequence of operating steps:

a pre-activity sequence of tasks, a call to a lower hierarchical operating level, a return from said lower operating level, and a post-activity sequence of tasks, and wherein the lowest hierarchical operating level is processed by at least one device test processor provided for the test of parameters of individual devices.

The invention also relates to embodiments with test level controllers incorporating a pre-activity sequence of tasks only, or a post-activity sequence of tasks only.

The testing apparatus according to the invention includes a test executor for performing and controlling the necessary steps of testing and test processing. For this purpose, it controls a test adapter which receives the DUT (in case of an IC tester, this may be a test socket), as well as handling tools for processing the physical or logical entities into which the DUT's are arranged. Again referring to an IC tester, such a handling tool may be a prober or handler.

In contrast to the prior art approach, the test executor according to the present invention comprises a high-sophisticated structural segmentation. Specifically, it makes use of a "level model" which reflects all of the various handling or packaging entities, in descending order. Every logical or physical entity into which the devices to be tested are arranged is reflected by a corresponding (physical or logical) hierarchical operating level. It is important to note that the entities in which the DUT's are arranged are not entities of equal importance, such as ceramic packaging versus plastic packaging. Instead, the operating levels are arranged such that an entity at a certain level comprises, i.e., includes at least one, but preferably multiple entities of lower order (this is why the term "hierarchical operating level" has been used). For instance, suppose that wafers to be tested in an IC tester are arranged in cassettes, wherein each cassette contains multiple wafers. On the other hand, as each wafer contains a multiplicity of identical IC's, we end up with the hierarchical operating levels "cassette—wafer—IC". If the cassettes are arranged in lots (which is, by the way, a logical entity, in contrast to the physical entities so far discussed), we have the levels "lot—cassette—wafer—IC". It is worth mentioning that this is a preferred embodiment of the invention. However, if we look, e.g., at a tester for parts of the automobile industry, the levels could be "lot—box—package—part".

It is understood that the various levels, and their operating characteristics, differ from application to application. Thus, what the customer has to do is apply the level structure, and the operating steps at each level, to his specific demands. In order to make this task easy, the present invention provides a unified structure at each level which is characterized by a test level controller. All test level controllers—regardless of the very level they serve for—are of similar structure. That is, each test level controller includes preferably:

A block of so-called pre-activity task sequences. These could be, in a preferred example:
  Communication (dialog) with the user, e.g., entry of process data, a user identification (ID) number, a level ID number, sublevel count etc.;
  input of process data, e.g., by reading such data from an appropriate execution input file;
  control command input, e.g., operator instructions such as to skip or repeat the very test level controller, quit operation or go on;
  operation of a handling tool, e.g., a prober. Suppose, for example, that the test level controller controls the "wafer" level of an IC tester. In such case, the pre-activity sequence could include an instruction to put the next wafer onto a test bed;
a call to a lower (preferably, but not necessarily the next lower) operating level;
a return from said lower operating level; and
a block of post-activity task sequences. These could preferably be:
  Data logging, i.e., processing and/or storing of acquired process data in a data logging file;
  again, operation of a handling tool—in the above example of a "wafer" level, this could be an instruction to remove the last wafer;
  the post-activity sequence could also include a communication with the user, and/or appropriate command input.

This "test level controller" structure is of a very general, uniform and easy-to-learn nature. As soon as a test level controller has completed its pre-activity task sequence, it calls a test level controller at a lower level. If appropriate, this further test level controller calls deeper levels, and then returns operation to the calling test level controller. That is, the test operation is segmented into a "cascaded structure".

However, there is one exception. This is the lowest hierarchical operating level which includes the actual test of the device; in case of an IC tester, this may be the appliance of electrical test ("stimulus") signals to the DUT, and the receipt of response signals from the DUT.

Operation at this level is not controlled by a test level controller of the above kind, but rather by a device test processor which contains and executes the instructions for the actual test. In contrast to the test level controller, the device test processor does not include the call of some processor or controller at a lower level (and, consequently, also no "return" function). Further, it may or may not include some pre- or post-activity task sequences (usually, it will not).

This operating concept has a multiplicity of outstanding advantages. First, all test level controllers are of basically the same kind, and thus easy to learn and to apply. They implement a uniform structure which does not require an extensive learning curve. Thus, a lot of time and money can be saved.

Second, the engineer at a production floor may easily adapt the operating environment to his needs. He does not have to train his operators (of lower skills) to the complete given test environment. In other words, the easy process of customization (e.g., interactive changes) provided by the present invention allows to keep to the knowledge and traditions already present at the relevant production floor. This increases safety and reliability, as the tester so-to-say adapts to human knowledge, instead of creating a need to adapt a human being to machine demands.

Third, it is very easy to modify or adapt an existing test structure. Suppose, for example, that an additional operating level has to be introduced, just because the cassettes containing wafers are delivered in packages. The additional "package" operating level may be easily implemented, without or only with minimal modifications in the adjoining levels. It is understood that this feature saves an enormous amount of time and money. It is even possible to deliver a testing apparatus with a "standard" operating model, which has only to adapted, i.e., modified by the customer!

Fourth, it is easy to split the various tasks of setting-up the tester control functions among various operators. This is just because the tasks can easily be segmented; for example, an operator may set up a certain operating level, with none or only minimal knowledge of the work of his colleagues, and without having insight into the complete test procedure.

Another important feature, in terms of easy modification, is that the device test modules can be easily replaced, or additional device test modules can be included, without interfering with the existing structure. By the way, this is the most common case, as the features of IC's or other devices to be tested are constantly enhanced, whereas the overall test equipment is seldom modified.

It is evident that this novel and advantageous concept may be easily enhanced. For example, it is not always necessary to call, from a certain operating level, the level just below; instead, one may allow "jumps", in dependence of operator instructions, or on an automatic basis. Likewise, operation of a test level controller may be repeated without return to the preceding level (e.g., in dependence of the test results), or the call of the next lower level may be skipped. It is also possible to call another test level controller at the same operating level. All of this functionality may be performed under operator or automatic control.

It has already been mentioned that the present invention is particularly suited for integrated circuit testers or board testers. However, it may also be useful for other kinds of testing equipment, such as test of goods upon delivery, mechanical testing, quality tests and the like.

The invention also relates to a method for testing and handling a multiplicity of devices which includes the following steps:
  Calling a test level controller,
  performing a pre-activity sequence of tasks,
  calling a next level processor at a lower hierarchical operating level,
  returning from said lower hierarchical operating level,
  performing a post-activity sequence of tasks, wherein said next level processor is a device test processor at the lowest hierarchical operating level, and another test level controller in all other cases.

It is understood and expressly noted that the present invention relates to all useful and novel combinations of the above disclosed features, whether alone or in any other or arbitrary combination.

BRIEF DESCRIPTION OF THE DRAWINGS

The invention will now be explained, by means of a non-limiting example, with reference to the accompanying drawings, in which:

FIG. 1 depicts an overall diagram of an integrated IC testing environment,

FIG. 2 is a structural diagram of a test level controller,

FIG. 3 depicts stacking of test level controllers, and device test processors, at various operating levels in the form of a timing diagram.

DETAILED DESCRIPTION OF THE PREFERRED EMBODIMENTS

Figure 4:
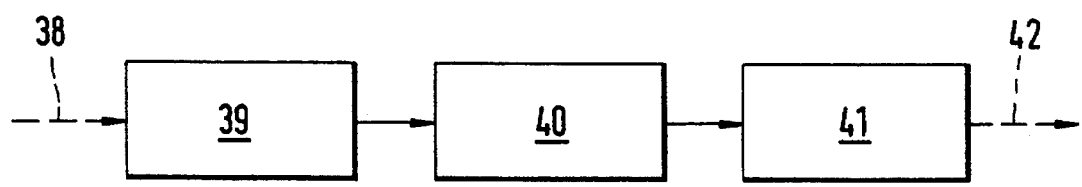
FIG. 4 shows an example of a pre-activity sequence of tasks and FIG. 5 an example of a post-activity sequence of tasks.

Referring now to FIG. 1, ref. no. 1 denotes an integrated circuit tester (IC tester) 1 including a display 2, a key-board 3 and all of the control circuitry required to test an integrated circuit, in particular a test controller or executor (which is basically a computer system). It is understood that the outer appearance may also be quite different; e.g., the data console may be separated from the tester itself.

Leads 4 connect the IC tester with a test head 5 for applying and contacting integrated circuits, or wafers to be tested (the so-called "DUT's", i.e., devices under test).

Device 6 is a handler able to handle cassettes which, in turn, contain wafers to be tested (the mechanical details of handler 6 are not shown in detail in FIG. 1, as they are anyway well known in the art). The handler takes a wafer from a cassette and applies it to test head 5 which sits right on top of the handler. The apparatus proceeds from IC to IC on a single wafer by advancing the wafer under test head 5 (of course, one could also move the test head instead, but this is not common practice). Tested wafers are removed and replaced by untested wafers. The same applies to cassettes.

Provided the cassettes pertain to one lot of DUT's to be tested, we can thus divide the test process into various logical and physical entities in a hierarchical order. The entity of the highest order is the lot, i.e., the totality of the cassettes (this is a logical entity, as no common packaging, or other tangible means which keep the cassettes physically together, is provided for all of the cassettes). If we go on in descending order, the next operating levels are the cassette level, the wafer level and the IC (die) level. All of these entities are physical entities, as their elements are kept together by physical means.

It will be understood that automated test processing requires that all steps are performed in the correct order. For example, once all wafers in a cassette have been tested, the apparatus has automatically to advance to the first wafer in the next cassette. Likewise, after the (successful or unsuccessful) test of a die, the apparatus has to advance to the next die, but only until all dice on the wafer have been tested, in which case the wafer has to be exchanged.

However, the test environment shown in FIG. 1 is only an exemplary embodiment. It will be noted that there exist a variety of alternate embodiments; for example, the "lot" level may be removed, the wafers may be packed in other units than cassettes (e.g., racks), or they may not be packed at all. Likewise, the hierarchical structure is different in case the devices under test are not wafers, but rather IC's (either unpacked or packed, such as in dual-in-line-packages). Yet another example are the various test adapters available on the market. In all of these cases, the user of the test environment (i.e., the "customer" from the viewpoint of the manufacturer of the tester) has to be able to adapt the test controller to his specific embodiment and demands, and it will be appreciated that this may be a costly, time-consuming and error-prone process.

The present invention provides a unique solution for this problem by the provision of a unified test structure which includes test level controllers of basically the same operating characteristics and outer appearance at each level (whether the corresponding entities is of logical or physical nature). FIG. 2 depicts a structural diagram of such a test level controller 10.

Operation starts at arrow 11. This is the entry from the next higher operating level (provided one exists; if not, it is simply the call from a supervisor program or an operating system). Box 12 includes a set of so-called "pre-activity sequence of tasks", i.e., tasks or actions to be performed at this very level before the next lower level is called, such as a dialog with the operator (more examples will be discussed below). Operation then proceeds to the next lower hierarchical operating level, as indicated by arrow 13.

When the test level controller at the next lower level has performed its task (which may include calls to even lower levels), operation returns to test level controller 10, see arrow 14. The test level controller then executes a set of "post-activity sequence of tasks" 15, like data logging (see more detailed discussion below). Thereafter, operation returns to the calling process, i.e., the next higher operating level (arrow 16).

As the test level controllers at each operating level are of basically similar structural design, we obtain thus a unified, "stacked" overall structure which permits easy modification and adaptation. In particular, a "sample" test executor may be provided to the customer for the purpose of adaptation, such that he does not have to start from scratch when creating his own test procedure.

The above explanation of the present invention requires some additional remarks. First, it will be understood that the lowest hierarchical operating level requires a different structure. This is just because there is no lower level which may be called. It is this very level—the test level—that contains the "device test processors", i.e., processors which directly execute the test of a die, such as test of the leakage current, the DC characteristics, the AC transmission characteristics, the response time etc. of a specific IC. For more details of the features and characteristics of the device test processor, reference is made to co-pending European patent applications... (attorney's docket nos.: 20-93-009 and 20-93-011), as well as European patent applications EP-A-541 840, EP-A-541 837 and EP-A-541 839, all of which are hereby incorporated by reference.

Second, there may be conditions which interrupt the regular flow of operation within a test level controller as described above. Suppose, for example, that the operator renders (during the pre-activity sequence of tasks) an instruction to skip an operating level, or that this information is retrieved from an execution input file. In such case, the call of the next lower operating level may be skipped, as indicated by dashed arrow 17. Likewise, a test level may be repeated (dashed arrow 18), e.g., if a specific test has failed. The last exception is continuation at the same test level, e.g., in response to an appropriate operator or command file instruction in the course of the post-activity sequence of tasks (dashed arrow 19).

Reference is now made to FIG. 3 which depicts the typical operation of the various test level controllers, as well as the device test processors, in the embodiment of FIG. 1 (time is running to the right). The "lot" level is designated as 20; likewise, the "cassette" level, the "wafer" level and the "die" level are labelled as 21, 22 and 23, respectively. The "test" level is below (23a). Boxes with hatching inclined to the right indicate a pre-activity sequence of tasks in FIG. 3, whereas hatching with inclination to the left indicates a post-activity sequence of tasks, and horizontal hatching relates to a device test processor.

Operation starts at the "lot" level, namely the pre-activity task sequence 24 of the test level controller assigned to the lot level. At each level, the test level controllers execute now their respective pre-activity task sequences, as indicated by reference numbers 25, 26 and 27, and perform a call to the test level controller of the next lower level.

This scheme continues down to the lowest level, wherein a device test processor 28 performs an actual test of a die. After execution of the post-activity task sequences 29 and 30 of the corresponding test level controllers, the latter are restarted, as indicated by pre-activity task sequence boxes 31 and 32. Thereafter, the next die is tested by a device test processor (box 33). This scheme continues until three dice have been tested (assuming that one wafer carries three dice—this is not a very reasonable assumption which has only been made for purposes of illustration, as an actual wafer will carry considerably more dice), and all test level controllers execute their respective post-activity task sequences, see boxes 34, 35, 36 and 37. Again, processing of more than one wafer, or more than one cassette have not been shown in FIG. 3 for graphical purposes, but it will be understood that such processing is performed in basically the same manner as multiple dice are tested, although at higher levels of operation.

FIG. 4 depicts a typical example of a pre-activity sequence of tasks to be performed by a test level controller. Entry into the pre-activity task sequence is indicated by dashed arrow 38. A first box 39 includes input of process data, such as level identification, sublevel count or reading data from an execution input file. Box 40 comprises a dialog with the operator, i.e., control command input such as an instruction to skip or repeat a level, to continue at the same level or to quit operation (cf. FIG. 2). (It will be understood that, instead of interactive operation, the respective instructions may also be read from a command file). Finally, box 41 includes instructions for handling devices, such as for handler 6 (FIG. 1), just before operation proceeds (dashed arrow 42).

Figure 5:
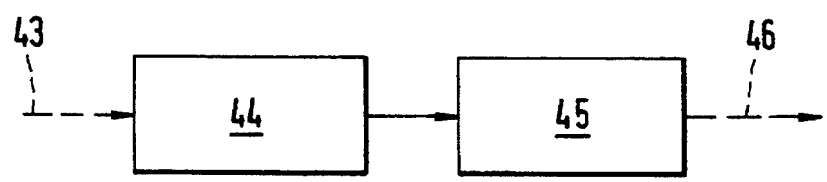

A similar example of a post-activity task sequence is given in FIG. 5. After entry (dashed arrow 43), appropriate control commands are rendered to the handling device (box 44). Thereafter, data (such as test data obtained from a DUT) are logged, e.g., in a data log file (box 45), and operation proceeds (dashed arrow 46).

However, it will be understood that the above examples for performing the pre-activity and post-activity sequences of tasks are not strictly necessary for practicing the present invention, and that they could be structured differently; for example, the post-activity task sequence may also include a dialog with the operator.

We claim:

1. Testing apparatus for testing and handling a multiplicity of devices comprising:
   (1.1) a test executor provided for controlling operation of the individual test steps,
   (1.2) at least one test adapter for receiving at least one device to be tested,
   (1.3) said devices arranged in plural entities that are logical and/or physical, each entity being hierarchically arranged among all said entities and representing a discrete category, and
   wherein said test executor includes a hierarchical operating level assigned to each of said physical or logical entities, and each said hierarchical operating level, except a lowest hierarchical operating level, including
   (1.4) at least one test level controller set up to perform at least the following sequence of operating steps:
      (1.4.1) A pre-activity sequence of tasks,
      (1.4.2) a call to a lower hierarchical operating level, and
      (1.4.3) a return from said lower operating level, and wherein
   (1.5) the lowest hierarchical operating level is processed by at least one device test processor provided for the test of parameters of individual devices.

2. Testing apparatus for testing and handling a multiplicity of devices comprising:
   (2.1) a test executor provided for controlling operation of the individual test steps,
   (2.2) at least one test adapter for receiving at least one device to be tested,
   (2.3) said devices arranged in plural entities that are logical and/or physical, each entity being hierarchically arranged among all said entities and representing a discrete category, and
   wherein said test executor includes a hierarchical operating level assigned to each of said physical or logical entities, and each said hierarchical operating level, except a lowest hierarchical operating level, including
   (2.4) at least one test level controller set up to perform at least the following sequence of operating steps:
      (2.4.1) A call to a lower hierarchical operating level,
      (2.4.2) a return from said lower operating level, and
      (2.4.3) a post-activity sequence of tasks, and wherein
   (2.5) the lowest hierarchical operating level is processed by at least one device test processor provided for the test of parameters of individual devices.

3. Testing apparatus according to claim 1, wherein said call to a lower hierarchical level is made to the next lower hierarchical level.

4. Testing apparatus according to claim 1 with at least three hierarchical operating levels, wherein the test level controller assigned to the highest hierarchical operating level performs a call to the test level controller assigned to the next lower hierarchical operating level, and so on until operation arrives at the lowest hierarchical operating level to which said device test processor is assigned.

5. Testing apparatus according to claim 4, wherein operation returns from said device test processor to the test level controller assigned to the next higher hierarchical operating level, and so on.

6. Testing apparatus according to claim 1, wherein the test level controller includes, in its pre-activity sequence of tasks, an instruction to skip the call to a lower hierarchical operating level if an appropriate indicator is set.

7. Testing apparatus according to claim 2, wherein the test level controller includes, in its post-activity sequence of tasks, an instruction to return to its pre-activity sequence of tasks if an appropriate indicator is set.

8. Testing apparatus according to claim 2, wherein the test level controller includes, in its post-activity sequence of tasks, an instruction to continue operation at the same hierarchical level of operations.

9. Testing apparatus according to claim 1 including at least one handling tool for processing said physical or logical entities.

10. Testing apparatus according to claim 1, wherein the pre-activity sequence of tasks includes at least one of the following tasks:

(10.1) Input of process data, (10.2) command input, (10.3) operation of at least one handling tool.

11. Testing apparatus according to claim 2, wherein the post-activity sequence of tasks includes at least one of the following actions:

(11.1) data logging, (1.1.2) operation of at least one handling tool.

12. Testing apparatus according to claim 1 being a testing apparatus for electronic components.

13. Testing apparatus according to claim 12 being a testing apparatus for integrated circuits.

14. Testing apparatus according to claim 12, wherein the hierarchical operating levels include at least one of the following levels:

(14.1) lot level, (14.2) cassette level, (14.3) wafer level, (14.4) die level.

15. Testing apparatus according to claim 2, wherein said call to a lower hierarchical level is made to the next lower hierarchical level.

16. Testing apparatus according to claim 2 with at least three hierarchical operating levels, wherein the test level controller assigned to the highest hierarchical operating level performs a call to the test level controller assigned to the next lower hierarchical operating level, and so on until operation arrives at the lowest hierarchical operating level to which said device test processor is assigned.

17. Testing apparatus according to claim 16, wherein operation returns from said device test processor to the test level controller assigned to the next higher hierarchical operating level, and so on.

18. Testing apparatus according to claim 2 including at least one handling tool for processing said physical or logical entities.

19. Testing apparatus according to claim 2 being a testing apparatus for electronic components.

20. Testing apparatus according to claim 19 being a testing apparatus for integrated circuits.

\* \* \* \* \*